United States Patent [19]
Singh et al.

[11] Patent Number: 5,820,942
[45] Date of Patent: *Oct. 13, 1998

[54] PROCESS FOR DEPOSITING A MATERIAL ON A SUBSTRATE USING LIGHT ENERGY

[75] Inventors: Rajendra Singh; Rahul Sharangpani, both of Clemson, S.C.

[73] Assignee: AG Associates, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 770,907

[22] Filed: Dec. 20, 1996

[51] Int. Cl.⁶ ..................................................... C08F 2/48
[52] U.S. Cl. ..................... 427/508; 427/96; 427/385.5; 427/421; 427/475; 427/485; 427/512; 427/557; 427/559; 427/561; 427/582; 427/595; 437/235
[58] Field of Search ..................................... 427/475, 485, 427/508, 557, 558, 559, 561, 582, 595, 294, 385.5, 421, 96, 512

[56] References Cited

U.S. PATENT DOCUMENTS

| | | | |
|---|---|---|---|
| 3,070,856 | 1/1963 | Fischbein | 49/489.1 |
| 3,501,334 | 3/1970 | Flaherty | 148/537 |
| 3,518,110 | 6/1970 | Fischbein | 428/335 |
| 3,589,606 | 6/1971 | Fish | 239/704 |
| 3,652,342 | 3/1972 | Fischbein et al. | 148/277 |
| 3,969,978 | 7/1976 | Seifert et al. | 89/7 |
| 4,012,551 | 3/1977 | Bogaty et al. | 427/284 |
| 4,264,790 | 4/1981 | Zlevor | 179/121 D |
| 4,296,208 | 10/1981 | Gagliani et al. | 521/77 |
| 4,305,796 | 12/1981 | Gagliani et al. | 204/159.19 |
| 4,404,256 | 9/1983 | Anand et al. | 428/409 |
| 4,430,978 | 2/1984 | Lewis et al. | 123/478 |
| 4,495,889 | 1/1985 | Riley . | |
| 4,532,620 | 7/1985 | Matsuda et al. | 369/136 |
| 4,562,088 | 12/1985 | Navarro . | |
| 5,048,163 | 9/1991 | Asmus et al. . | |
| 5,068,210 | 11/1991 | DiLazzaro et al. | 501/32 |
| 5,134,961 | 8/1992 | Giles et al. . | |
| 5,175,433 | 12/1992 | Browner et al. | 250/343 |
| 5,196,062 | 3/1993 | Bergmann et al. | 118/69 |
| 5,204,289 | 4/1993 | Moh | 501/15 |
| 5,230,740 | 7/1993 | Pinneo | 118/723 |
| 5,238,471 | 8/1993 | Blanchet-Fincher . | |
| 5,312,790 | 5/1994 | Sengupta et al. | 501/137 |
| 5,356,668 | 10/1994 | Paton et al. | 427/2.25 |
| 5,361,800 | 11/1994 | Ewin | 137/495 |
| 5,371,403 | 12/1994 | Huang et al. | 257/691 |
| 5,393,712 | 2/1995 | Rostoker et al. | 438/471 |
| 5,451,260 | 9/1995 | Versteeg et al. | 118/725 |
| 5,540,772 | 7/1996 | McMillan et al. | 118/50 |

FOREIGN PATENT DOCUMENTS

| | | |
|---|---|---|
| 673962A | 4/1990 | Switzerland . |
| 1409340A | 7/1988 | U.S.S.R. . |
| 1579572A | 7/1990 | U.S.S.R. . |

OTHER PUBLICATIONS

"Notes on Drying Paints by Radian Heat", pp. 1–20, ICI Limited (no date available).

DuPont Teflon AF amorphous Fluoropolymer brochure, Wilmington, Delaware (no date available).

*Primary Examiner*—Bernard Pianalto
*Attorney, Agent, or Firm*—Dority & Manning, P.A.

[57] ABSTRACT

The present invention is generally directed to a process and a system for transforming a liquid into a solid material using light energy. In particular, a solution containing a parent material in a liquid form is atomized in a reaction vessel and directed towards a substrate. The atomized liquid is exposed to light energy which causes the parent material to form a solid coating on a substrate. The light energy can be provided from one or more lamps and preferably includes ultraviolet light. Although the process of the present invention is well suited for use in many different and various applications, one exemplary application is in depositing a dielectric material on a substrate to be used in the manufacture of integrated circuit chips.

40 Claims, 11 Drawing Sheets

PROCESS FOR DEPOSITING A MATERIAL ON A SUBSTRATE USING LIGHT ENERGY

FIELD OF THE INVENTION

The present invention is generally directed to a process for depositing a solid material on a substrate. More particularly, the present invention is directed to a process for forming a solid coating on a substrate from a liquid precursor using light energy. For instance, in one embodiment, a liquid solution containing a fluoropolymer is atomized and contacted with light energy, causing the fluoropolymer to form a film and adhere to a substrate. The process of the present invention is particularly well suited for use in the manufacture of integrated circuit chips, multiple chip modules, and power devices.

BACKGROUND OF THE INVENTION

In general, an integrated circuit refers to an electrical circuit contained on a single monolithic chip containing active and passive circuit elements. Integrated circuits are fabricated by diffusing and depositing successive layers of various materials in a preselected pattern on a substrate. The materials can include semiconductive materials such as silicon, conductive materials such as metals, and low dielectric materials such as silicon dioxide. Of particular significance, the semiconductive materials contained in integrated circuit chips are used to form almost all of the ordinary electronic circuit elements, such as resistors, capacitors, diodes, and transistors.

Integrated circuits are used in great quantities in electronic devices, such as digital computers, because of their small size, low power consumption, and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

As stated above, integrated circuit chips are manufactured by successively depositing layers of different materials on a substrate. Typically, the substrate is made from a thin slice or wafer of n-type or p-type silicon. The active and passive components of the integrated circuit are built within a thin n-type epitaxial layer on top of the substrate. The components of the integrated circuit can include layers of different conductive materials such as metals and semiconductive materials surrounded by low dielectric insulator materials. In attempting to improve integrated circuit chips, attention has been focused upon not only using different materials to construct the chips but also upon discovering new processes for depositing the various layers of materials on the substrate.

For instance, one area of circuit chip technology needing improvement is in the deposition of insulator materials used in the chips. Such an insulator material should have a very high resistivity, as low as possible dielectric constant, and sustainability of subsequent process steps and materials used in chip manufacturing. The low dielectric insulator materials are incorporated into integrated circuits in order to reduce power dissipation when the circuit is in use. If insulator materials with low dielectric constants (less than silicon dioxide) could be incorporated into integrated circuits, then the circuits would require less power and would simultaneously operate at higher speeds.

Currently, silicon dioxide is the most widely used electric insulator material. Silicon dioxide, however, which has a dielectric constant of about 3.84, is inadequate in meeting the stringent demands of proposed future fast, high performance and reliable low voltage devices.

Thus, those skilled in the art have been attempting to find a replacement to silicon dioxide for use in electronic circuits and other low voltage electronic devices. One alternative that has been suggested for use as an electric insulator in integrated circuits are amorphous fluoropolymers. For example, a fluoropolymer known as TEFLON AF marketed by EI DuPont de Nemours and Company has the lowest known dielectric constant of any plastic material. Unfortunately, problems have been experienced in attempting to deposit fluoropolymers on circuit chips. Not only has it been found difficult to form a film with good physical properties, but fluoropolymers do not readily adhere to substrates.

In the past, in order to form a film, fluoropolymers have been spin coated on substrates. According to this process, the substrate is first placed on a vacuum chuck and rotated at high speeds. A solution containing the fluoropolymer is then applied to the substrate. Due to centrifugal force, a coating is formed on the substrate which is dried and annealed on a hot plate or in a furnace. As described above, however, difficulties have been encountered with this process in getting the fluoropolymer to adhere to the substrate and in producing a film having good physical properties. Such deposition method usually generates course material with undesirable physical properties. Further, other problems have also been experienced in controlling various parameters, such as the thickness of the film.

In view of the above deficiencies of the prior art, a need exists for an insulating film that can be used as a replacement to silicon dioxide in electrical devices. A need also exists for a process for depositing various materials, such as insulators, on substrates for use in integrated circuit chips. In particular, a need exists for a process for depositing fluoropolymers on substrates, such as silicon, during the fabrication of integrated circuits.

In broader and more general terms, a need also exists for a new process for depositing a film or coating of a material on a substrate for use in any application, such as during the fabrication of integrated circuits.

SUMMARY OF THE INVENTION

The present invention recognizes and addresses the foregoing disadvantages, and others of prior art constructions and methods.

Accordingly, it is an object of the present invention to provide a process for depositing a material on a substrate.

Another object of the present invention is to provide a process for depositing and adhering a coating or a thin film of a material on a substrate using light energy.

It is another object of the present invention to provide a process for depositing a material on a substrate by converting a material in liquid form to a solid form using light energy.

Still another object of the present invention is to provide an apparatus designed to convert a liquid to a solid using light energy.

It is another object of the present invention to provide a process for depositing layers of different materials on a substrate, such as a silicon wafer, during the fabrication of integrated circuit chips.

Another object of the present invention is to provide a process for forming a polymer coating, such as a fluoropolymer coating or a polyimide coating, on a substrate.

It is still another object of the present invention to provide a process for depositing conductive transparent materials on a substrate.

These and other objects of the present invention are achieved by providing an improved chemical vapor deposition process. As used herein, chemical vapor deposition refers to a process by which a solid film or coating is grown from a liquid or gas precursor. In general, the process of the present invention includes directly injecting a liquid precursor into a reaction vessel containing a substrate. Once injected into the reactor vessel, the liquid precursor is subjected to light energy, causing the liquid precursor to form a solid coating on the substrate.

Various chemical vapor deposition systems and processes have been proposed in the past for carrying out various purposes. Most prior art systems, however, use gas precursors that are inserted into a reactor vessel. In fact, in some prior art systems, it is necessary to first vaporize a liquid before introducing it into a reactor. In many applications, the gases that are used or produced during the process are hazardous or toxic requiring many safety measures to ensure that there are no leaks in the system.

Further, prior art systems have generally used furnaces to heat the gas in the reactor, which have high energy requirements and require substantial start-up times before being used. Finally, many prior art systems are directed to forming solid bulk materials and are thus inapplicable for forming thin films and coatings.

The process of the present invention provides many advantages over prior art systems. Of particular importance, the system of the present invention allows a liquid to be directly injected into a reactor vessel. Thus, no toxic gases are formed or used making the process safer and more environmentally friendly than many prior art configurations. Further, the liquid is transformed into a solid using only light energy. The process offers great precision and repeatability, is energy efficient, and minimizes the amount of material needed to form the solid coating or film. Further objects, features, advantages and aspects of the present invention are discussed in greater detail below or will be apparent from the following description.

In summary, the present invention is directed to a process for depositing a material on a substrate using light energy. The process includes the steps of first atomizing a solution containing a parent material in a liquid form into droplets. The liquid droplets are directed onto a substrate. Before contacting the substrate, the liquid droplets are exposed to light energy, which causes the parent material to form a solid coating on the substrate. In some configurations, the substrate is also heated to aid in the deposition process.

In one embodiment, the liquid droplets are directed onto the substrate in a reaction chamber. The reaction chamber is capable of maintaining a vacuum. The light energy absorbed by the liquid droplets can originate from lamps and can include ultraviolet light and vacuum ultraviolet light. Specifically, the light contacting the droplets can include light rays having a wavelength of less than about 0.8 microns. Alternatively, the droplets can be contacted with a combination of ultraviolet light and visible light. Visible light having a wavelength of 0.4 microns or greater supplies thermal energy and can also supply optical energy. When the light energy is originated from a lamp, the lamp can emit from about 1.5 eV to about 20 eV of energy.

In a particular embodiment, the process of the present invention is directed to depositing a fluorocarbon polymer on a substrate. The process includes the steps of first atomizing a solution of a fluorocarbon polymer dissolved in a solvent into liquid droplets. The liquid droplets are directed onto a substrate. Before contacting the substrate, the solvent contained in the liquid droplets is vaporized using light energy. Light energy is added to the droplets in an amount sufficient to not only evaporate the solvent but also to cause the fluorocarbon polymer to form a solid coating on the substrate.

The fluorocarbon polymer dissolved in the solvent can be a copolymer of tetrafluoroethylene and 2,2-bis(trifluoromethyl)-4,5-difluoro-1,3-dioxole. The fluorocarbon polymer can be present in the solution in an amount less than about 1 percent by weight, and particularly less than about 0.6 percent by weight.

When forming a fluorocarbon polymer film according to the present invention, thermal light energy is needed in order to vaporize the solvent. Preferably, the liquid droplets are also exposed to optical light energy, such as ultraviolet light and vacuum ultraviolet light. The light provides the energy for binder evaporation and chemical reaction to cause the polymerization of the substance material. The liquid droplets directed towards the substrate can have a diameter of less than about 20 microns, and particularly less than about 16 microns. The substrate used in the process can be made from silicon or from other semiconductive materials, from glass, or from many other different materials. The fluorocarbon polymer can form a coating on the substrate having a thickness of less than about 50 microns, and particularly less than about 1 micron.

In one embodiment, the liquid droplets formed from the fluorocarbon solution are directed towards a substrate in a reaction chamber. The reaction chamber can be preheated to a temperature of from about 50° C. to about 100° C. prior to receiving the liquid droplets.

A fluorocarbon polymer film made according to the present invention is particularly well suited for use as a dielectric layer in integrated circuits and other electrical devices. Besides dielectric layers, however, the process of the present invention can also be used to deposit various other materials in circuit chips including conductive materials and semiconductive materials. In fact, it is believed that the process can even be used to deposit and improve the properties of silicon dioxide layers in integrated circuits.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which.

Figure 1:
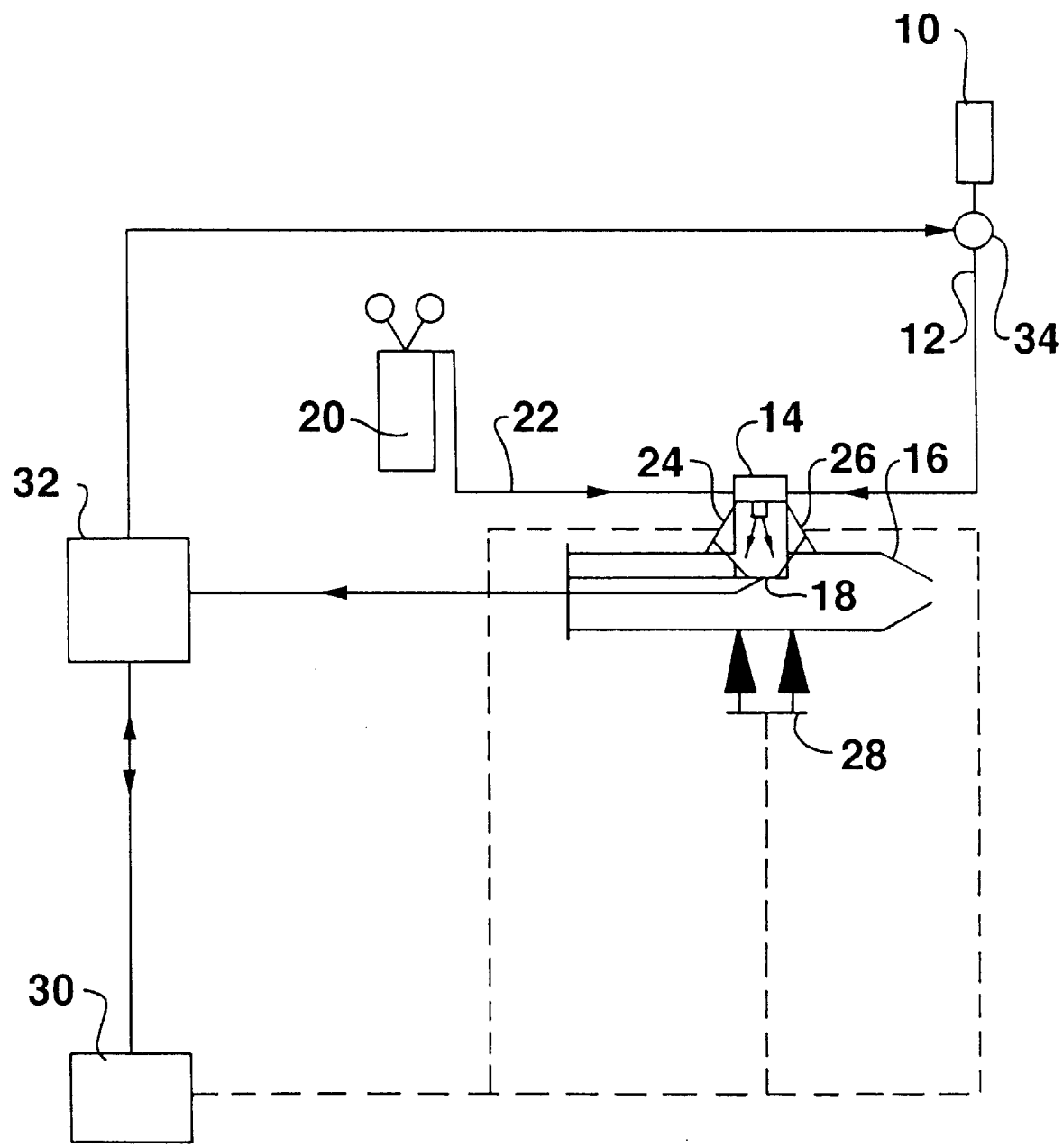
FIG. 1 is a plan view of one embodiment of a system for depositing a solid material on a substrate according to the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

In general, the present invention is directed to a process and system for depositing a solid material on a substrate using light energy. More particularly, liquid droplets containing a parent material are directed towards a substrate and exposed to light energy. The light energy causes the parent material contained within the droplets to form a solid coating on the substrate.

The process of the present invention has many different applications. For instance, in one embodiment, the process of the present invention is well suited to depositing various layers of different materials on a wafer for forming an integrated circuit chip. For example, polyimides and fluoropolymers can be deposited upon a substrate for forming an electrical insulator in a circuit chip. Conductive materials, semiconductive materials, and other insulators including silicon dioxide can also be deposited within an integrated circuit chip according to the process.

A general description of the process of the present invention will now be discussed with reference to FIGS. 1, 1A, and 2. A detailed description of a particular application of the present invention will then be described. Following the description of a particular application, some of the many other different applications of the present invention will be listed.

Referring to FIG. 1, a system for converting a liquid precursor into a solid coating on a substrate according to the present invention is illustrated. In order to initiate the process, first a liquid precursor is formulated and placed in a liquid reservoir 10. The liquid precursor contains, in some form, a parent material that is to be later converted into a solid. The liquid precursor can be a pure liquid or can be a solution. For instance, in one embodiment, the liquid precursor can contain the parent material dissolved in a solvent.

Figure 2:
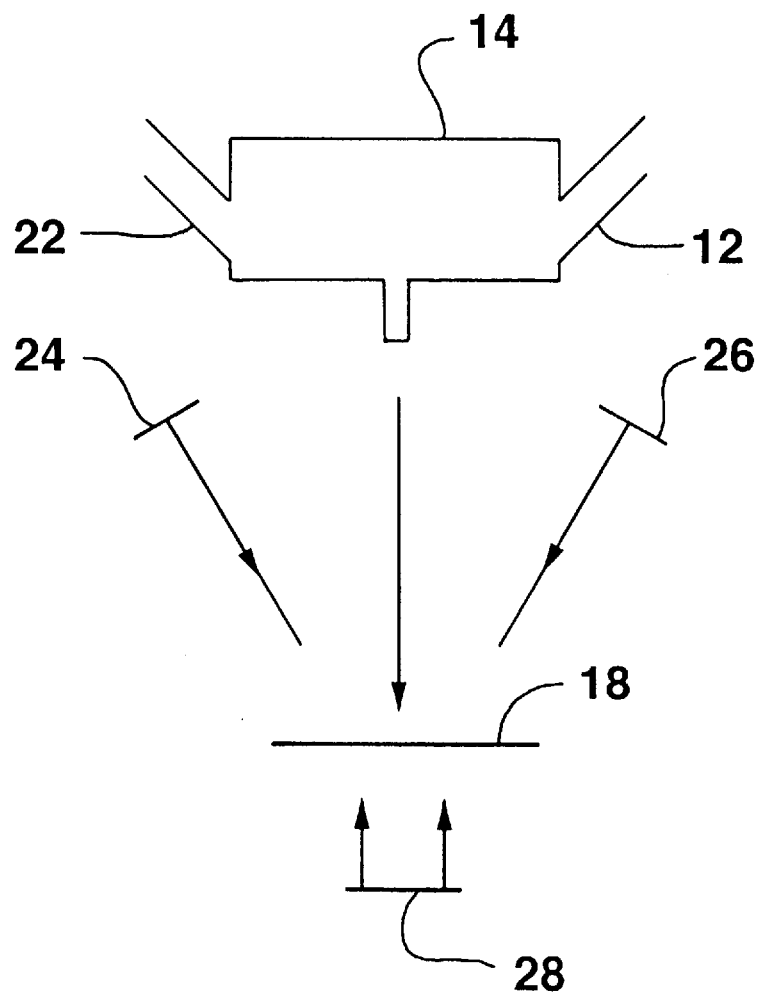
FIG. 2 is a plan view of one embodiment of a nozzle used to form solid materials according to the present invention.

The liquid precursor contained in liquid reservoir 10 according to the present invention is fed by a conduit 12 to a nozzle 14, which is more clearly shown in FIG. 2. Nozzle 14 atomizes the liquid precursor into liquid droplets. The liquid droplets are directly injected into a reactor vessel 16 towards a substrate 18.

In the embodiment illustrated in FIGS. 1 and 2, nozzle 14 atomizes the liquid precursor using a pressurized gas. Specifically, the system includes a gas reservoir 20 in communication with nozzle 14 via a gas conduit 22. The gas that is used to atomize the liquid precursor should not adversely interfere with the deposition process. In most applications, the gas used to atomize the liquid precursor should be an inert gas, such as argon or nitrogen. In some applications, however, the solid material is formed from the liquid precursor by reacting the liquid precursor with the atomizing gas as will be discussed in more detail below.

In general, any suitable atomizing nozzle may be used in the process of the present invention. Also, more than one nozzle maybe used in the system, which, in some applications, may lead to better uniform application of the liquid precursor. In most applications, the nozzle must be capable of producing liquid droplets having a diameter of less than about 30 microns. In an alternative embodiment to the system illustrated in FIG. 1, a nozzle can be chosen that does not use a pressurized gas in order to atomize a fluid. For instance, the nozzle may atomize the liquid using sound waves or some other high pressure source.

Once the liquid precursor is atomized, the resulting liquid droplets are directed towards substrate 18 in reactor vessel 16. During the process, substrate 18 can be rotated and/or scanned to ensure maximum deposition uniformity. Substrate 18 can generally be made from any material as is necessary for the particular application. The substrate also can have any shape. For instance, the substrate can be a wafer, a film, a fiber, a wire, or a ribbon. Further, the substrate can have a three-dimensional conformation, including curved surfaces.

According to the present invention, as the liquid droplets are directed towards substrate 18, they are exposed to light energy. For instance, as shown in the figures, substrate 18 is surrounded by lamps 24, 26 and 28. Lamps 24, 26 and 28 can emit either optical energy, thermal energy, or both. Optical energy causes atomic and molecular excitation within the droplets, while thermal energy increases vibrational motion within the droplets. Optical energy can be provided by ultraviolet light, vacuum ultraviolet light, and visible light which is present at wavelengths of from about 0.05 microns to about 0.8 microns. Thermal energy, on the other hand, is contained in light having a wavelength of from about 0.4 microns and higher. Light at wavelengths in the range of from about 0.4 microns to about 0.8 microns provide both optical energy and thermal energy.

As the liquid droplets fall towards substrate 18, the light energy contacting the droplets causes the parent material contained within the liquid precursor to form a solid coating on the substrate. More particularly, the light energy can cause various chemical transformations to occur. For instance, in one embodiment, the liquid precursor can be a solution containing a solvent which is evaporated by the light energy. As the solvent is evaporated, the parent material falls out of solution and forms a solid.

In an alternative embodiment, the liquid precursor, when contacted with the light rays, decomposes or otherwise undergoes a chemical change, transforming into a solid material. In a further embodiment, the light energy causes the liquid precursor to react with a gas, such as the atomizing gas, or to react with other components contained in the solution. This reaction can form a solid material. Regardless of the chemical or physical change that occurs, however, in each application the light energy contacting the droplets transforms components in the liquid ultimately into a solid.

In some applications, only optical energy is necessary for the transformation to occur. In this embodiment, the liquid droplets and reactor vessel 16 are never heated during the process. Alternatively, in other applications, only thermal energy or a mixture of thermal and optical energy are used.

The embodiment illustrated in FIG. 1 is intended to show the use of lamps emitting both thermal and optical energy.

Specifically, lamp 28 which is positioned below substrate 18 is used primarily as a thermal energy source for heating the liquid droplets and the substrate. Lamps 24 and 26, on the other hand, are designed primarily for emitting optical energy, such as ultraviolet light including vacuum ultraviolet light, onto the liquid droplets and substrate 18.

Lamps 24, 26 and 28 need to deliver a sufficient amount of energy to the liquid droplets for causing the liquid droplets to vaporize, react, or decompose and transform the parent material into a solid. Generally, the amount of energy required will depend upon the size of the liquid droplets and the time it takes for the droplets to travel from nozzle 14 to substrate 18.

Besides causing the parent material contained within the liquid precursor to form a solid, the light energy emitted by lamps 24, 26 and 28 can also provide other benefits and advantages. For instance, in one application, substrate 18 can be contacted by the light rays causing the substrate to adhere to the parent material as it is coated upon the substrate. For instance, the light rays may change the electrostatic attraction between the substrate and the parent material.

Various lamps that may be used in the system of the present invention include arc lamps and tungsten halogen lamps, which emit both thermal and optical energy. Lamps that primarily emit ultraviolet light and can be used in the present invention include deuterium lamps, mercury vapor lamps, xenon lamps, and incoherent excimer lamps. For most applications, the incoherent light source lamps should provide to the reaction chamber from about 1.5 eV to about 20 eV of power. As many lamps as are necessary for the process may be used and the lamps may be placed in any suitable configuration. The location of the lamps illustrated in FIG. 1 is merely exemplary.

The lamps used in the process of the present invention should generally provide light rays throughout most of the reaction vessel to ensure that the liquid droplets are constantly being exposed to light energy as they travel towards substrate 18. In this regard, lamps emitting small focused rays of light and lasers, are not particularly well suited for use in the present invention. Thus, non-focused incoherent lamps are generally preferred.

Through the use of lamps and light energy, the process of the present invention offers many advantages over conventional chemical vapor deposition processes incorporating furnaces and other similar heat sources to generate the solid material. For instance, the lamps have much higher heating and cooling rates than conventional furnaces. Through the use of lamps, a rapid isothermal processing system is produced. The lamps provide instantaneous energy, typically requiring no substantial start up period.

Further, the energy emitted by the lamps can be easily and precisely controlled and varied. For instance, during the process of the present invention, as the liquid precursor is formed into a solid, the energy absorbed by the liquid droplets has a tendency to cool the surrounding atmosphere. Light energy, as opposed to other energy sources, can be instantaneously increased during the process if necessary in order to maintain the reaction conditions constant. Specifically, light energy allows instantaneous recovery from any reactions or transformations occurring that are endothermic.

By using light energy and the use of lamps, the reaction rate and the rate at which the solid is formed can also be accurately controlled. For instance, formation of the solid during the process of the present invention can be abruptly stopped at any time simply by turning off the lamps and discontinuing the flow of light energy to the reaction chamber. The lamps can also be equipped with gradual power controls that can be used to increase or decrease the reaction rate with very quick response times. In the past, chemical vapor deposition processes typically used furnaces which only gradually heat up and cool down. Furnaces and other similar devices, as opposed to lamps, require a substantial amount of lag time between adjusting the power controls and the effect the adjustment has on the reaction or process being carried out.

Because light energy is used during the process of the present invention, reactor vessel 16 should be made from or lined by a material that acts as an insulator, has a low thermal mass, and is a poor heat conductor. By using a material that does not absorb heat or light energy, the energy requirements of the process are minimized. For instance, in one embodiment, reactor vessel 16 can be made from quartz and can include a substrate holder also made from quartz. Alternatively, the substrate holder can be made from graphite coated with silicon carbide.

In another embodiment, the lamps used to supply light energy to the process of the present invention can be placed inside the reactor vessel itself. In a this embodiment, reactor vessel 16 can be made from any suitable material, including metals. By placing the lamps inside reactor vessel 16, the vessel need not be made from an insulator material.

Reactor vessel 16 should also be capable of being evacuated for creating a vacuum within the chamber. In particular, a vacuum is needed when transmitting ultraviolet rays into the reaction vessel having a wavelength of less than about 0.2 microns. When such ultraviolet rays of light are not necessary to the process, however, reaction vessel 16 can be operated at normal atmospheric pressures.

Figure 1A:
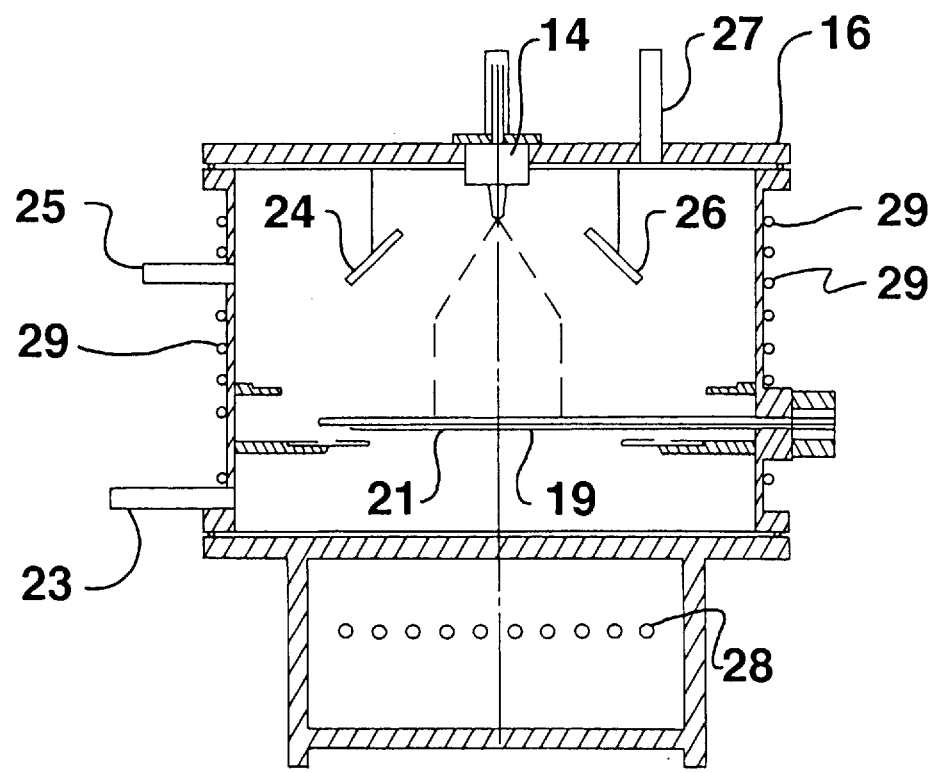
FIG. 1A is a cross sectional view of one embodiment of a reactor vessel that may be used in the process of the present invention.

Referring to FIG. 1A, one embodiment of a reactor vessel 16 that may be used in the process of the present invention is illustrated. Reactor vessel 16 includes a nozzle 14 which atomizes and directs a liquid precursor onto a substrate which is supported on a substrate holder 19. Substrate holder 19 is adapted to receive a thermocouple 21 for monitoring the temperature of the substrate during the process. Reactor vessel 16 further includes a lamp 28 which is generally adapted to emit thermal energy and lamps 24 and 26 which are generally adapted to emit optical energy.

In this embodiment, reactor vessel 16 also includes a vacuum line 23 which can be used to create a vacuum within the vessel. On the other hand, if it is desired to pressurize the vessel or to maintain an inert atmosphere within the vessel, a gas line 27 is provided for introducing a gas into reactor vessel 16. Gas line 27 can also be used to introduce a gas into reactor vessel 16 for reaction with the liquid precursor. A conduit 25 is adapted to receive a pressure gage for monitoring the pressure during the process.

Reactor vessel 16 as shown in FIG. 1A further includes a cooling line 29, which is wrapped around the outside perimeter of the vessel. Cooling line 29 is adapted to circulate a cooling fluid such as water if desired. For instance, a cooling fluid can be circulated through line 29 in order to control and maintain the temperature within reactor vessel 16.

Referring to FIG. 1, the process of the present invention can be fully automated if desired. For example, the system can include a controller 30 such as a microprocessor or computer. Controller 30 is in communication with lamps 24, 26 and 28 and in communication with a temperature controller 32. Temperature controller 32 monitors the temperature of substrate 18, such as through a thermocouple as illustrated in FIG. 1A. Temperature controller 32 is also in communication with a valve 34, such as solenoid valve.

In this arrangement, controller 30 can receive information from temperature controller 32 and, based on the information, control the amount of thermal light energy emitted by lamp 28 (and, if emitting thermal energy, lamps 24 and 26). Controller 30 also controls the flow rate of the liquid precursor from liquid reservoir 10 to nozzle 14. For instance, controller 30 can be programmed to only feed the liquid precursor into reactor vessel 16 when substrate 18 is within a particular temperature range. Further, the temperature within reactor vessel 16 can be maintained and controlled by automatically adjusting the amount of energy emitted by lamps 24, 26 and 28. Thus, a further benefit to using light energy in the process of the present invention is the ability to accurately control the process and the reaction conditions from a remote location.

The system of the present invention can be operated as a stand alone unit for depositing a single layer or multiple layers of a material on a single substrate. Alternatively, the apparatus of the present invention can be incorporated into an integrated system for continuously depositing a single layer or multiple layers of a material on a plurality of substrates. For instance, a conveying device can automatically feed substrates into reactor vessel 16 where a film or a plurality of films are deposited upon the substrate. The conveying device can then also be used to remove the substrates from the reactor vessel and then, if desired, place the substrates in a second reaction vessel for depositing other layers of a different material on the substrates. As many systems as illustrated in FIG. 1 as are needed for the particular application can be placed in succession for automatically starting with a substrate and ending with a finished product.

As stated above, the process of the present invention is particularly well suited for use in the manufacture of integrated circuit chips. In particular, the process can be used to deposit various materials for different purposes in an integrated circuit. One particular application is the deposition of a dielectric material on a chip for providing the electronic device with an electrical insulator where needed. The material can be, for instance, a polyimide or a fluoropolymer. In this regard, for exemplary purposes, the following is a detailed description of a process for depositing a coating of a fluoropolymer on a substrate according to the present invention.

One particular fluoropolymer well suited for use in the present invention and for use in the manufacture of integrated circuits is an amorphous fluorocarbon polymer marketed under the name TEFLON AF by the EI DuPont de Nemours and Company. More particularly, the fluoropolymer is a copolymer of tetrafluoroethylene and 66 mole percent of 2,2-bis(trifluoromethyl)-4,5-difluoro-1,3-dioxole having the following chemical formula:

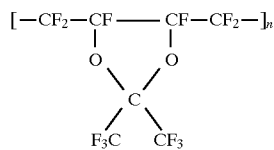

When used in the process of the present invention, the amorphous fluorocarbon polymer is first dissolved in a solvent such as a fluorocarbon. A particular solvent into which the fluorocarbon polymer is soluble is FC-77 FLUORINERT electronic liquid marketed by the 3M Company located in St. Paul, Minn. FC-77 is a fluorocarbon having the chemical formula $C_8F_{18}$.

When the above fluorocarbon polymer solution is used in the process of the present invention, light energy is used to evaporate the solvent and cause the fluorocarbon polymer to polymerize and form a film adhering to a substrate. The thickness of the film that is formed is determined, in part, based on the polymer concentration in the solvent. In most electronic applications, the thickness of the film should be under about 50 microns, and particularly from about 1 monolayer to about 50 microns. Thus far, it has been found that films falling within the above thickness range can be made from solutions having a fluorocarbon polymer concentration of less than about 1 percent, and particularly from about 0.01 percent to about 0.6 percent by weight.

It has also been discovered that if ultraviolet light is used in producing the film, then polymer concentrations must be increased. For example, in one embodiment, when forming a film having a thickness of from about 0.5 microns to about 1 micron, the polymer concentration should be about 0.067 percent when only using thermal energy to form the film and about 0.13 percent when using both thermal and optical energy to form the film.

Besides having an impact on the thickness of the film, the solvent mixed with the fluorocarbon polymer is also used to decrease the viscosity of the solution. In particular, the solvent is used to increase the viscosity of the liquid precursor so that the fluid will not clog up the nozzle and will form smaller droplets when atomized.

Once the fluorocarbon polymer solution is formulated, the solution is fed to a nozzle and atomized using a gas or other pressure source. When using a gas to atomize the solution, preferably an inert gas is chosen, such as argon or nitrogen, in order to prevent any unwanted reactions occurring between the atomizing gas and the solution.

The size of the liquid droplets that are produced when the solution is atomized affect, to some extent, the quality of the film that is formed. In general, smaller liquid droplets yield better film formation having less defects and better quality. Further, smaller droplets require less energy for evaporating the solvent when forming the film.

The size of the liquid droplets depends to a large extent on the nozzle that is used. Generally speaking, the liquid droplets should have a diameter of less than about 20 microns. When using a system as illustrated in FIG. 1, nozzle 14 has been found to produce droplets having a size less than about 17 microns, and particularly having a size from about 13 microns to about 17 microns. In order to atomize the polymer solution, argon gas was used at a pressure of about 30 psi.

Once atomized, the fluorocarbon polymer solution is directed towards a substrate which is ultimately coated by the fluoropolymer. When the fluoropolymer is to be used in an integrated circuit, the substrate in most applications will be a silicon wafer. Other substrates, however, may be made from, for instance, other semiconductors such as indium phosphide or gallium arsenide. In general, the process of the present invention can be used with any suitable substrate. Further, the substrate can also be a partially fabricated integrated circuit containing various layers of other materials, such as layers of conductive metals including aluminum or copper. Preferably, the substrate has a low thermal mass so that the substrate does not absorb a large percentage of the light energy.

According to the present invention, as the fluoropolymer solution droplets are directed towards a substrate, the droplets are exposed to light energy. As described above, the light energy, in this embodiment, evaporates the solvent and causes the fluorocarbon polymer to polymerize and form a solid on the substrate. In this application, thermal light energy is needed for the solid film to form. Optical light energy, such as present in ultraviolet light vacuum ultraviolet light and visible light, is optional. The thermal energy is needed in order to evaporate the solvent. Thus far, good results have been obtained when the substrate and the reactor vessel are heated to approximately 50° C. prior to atomizing the fluoropolymer solution.

More particularly, it has been found that heating the substrate to about 50° C. ensures that all of the solvent within the liquid droplets is evaporated prior to reaching the substrate. When atomizing the fluoropolymer solution to droplets having a size of less than about 20 microns, it only takes approximately 5 milliseconds at 50° C. to completely vaporize the solvent. In most applications, however, the droplets should be given more than 5 milliseconds to reach the substrate to completely ensure that only the vapor phase reaches the substrate.

After the solvent has been completely evaporated, fluorocarbon polymer particles having a size of approximately 0.1 microns ultimately reach the substrate. The light energy contacting the particles causes the fluorocarbon polymer to polymerize and form a solid film on the substrate. The light energy can also cause the substrate to form an electrostatic attraction with the polymer.

As stated above, when forming a fluorocarbon polymer film according to the present invention, optical light energy is not needed. Better results, however, are obtained when optical light energy is present. It is believed that optical energy excites the fluorocarbon polymer particles resulting in better film formation. In particular, it has been found that films formed using optical energy have less stress, have less defects, have better electrical and mechanical properties and are better insulators than fluorocarbon polymer films formed solely from thermal light energy.

After the fluorocarbon polymer film is formed on the substrate according to the process of the present invention, preferably the film is then annealed. For instance, in one embodiment, the film can be annealed at a temperature of about 200° C. for about 10 minutes. Annealing the film enhances adhesion between the substrate and the film and improves the morphology of the film.

In fabricating electrical devices, it may also be necessary to etch portions of the formed fluorocarbon polymer film in order to expose conductive materials that were earlier deposited on the substrate. Etching a fluorocarbon polymer film can be performed with argon, oxygen or carbon tetrafluoride plasmas.

When incorporated into integrated circuits, TEFLON AF fluoropolymers perform as excellent insulators, having a dielectric constant of less than 2. For most applications, the lower the dielectric constant of a material, the better the material will perform as an insulator in electronic devices, minimizing power loss during operation of the device. Besides TEFLON AF fluoropolymers, however, many other commercially available polymers may be used in the process of the present invention for the purpose of insulating electrical devices. For instance, examples of other commercially available products that may be used as liquid precursors include the following:

TABLE 1

| COMPANY | PRODUCT | DIELECTRIC CONSTANT |
|---|---|---|
| DuPont | FTI-45M polyimide | 2.8 |
| Asahi glass | CYTOP | 2.24 |
| DuPont | PMDA/TFMB polyimide | 2.6 |
| Allied signal | X515 polyimide | 2.89 |
| DuPont | 6FCDA/TFMB polyimide | 2.5 |
| Allied signal | FLARE | 2.65 |
| DuPont | PMDA/TFMOB polyimide | 2.6 |

It should be understood that forming a polymer film for use in integrated circuits is merely one application of the process of the present invention. The above description directed to forming a fluoropolymer film is provided merely for exemplary purposes. Many other different solid materials may be formed through the process of the present invention for many diverse applications. Other exemplary applications are listed below in the following table. The listed items are other applications in silicon and optoelectronic integrated circuit manufacturing. Deposition of the material can occur directly on a silicon or semiconductor substrate or on a substrate coated with conductive materials, such as aluminum or copper, barrier layers, such as those made from titanium, or dielectric materials.

TABLE 2

| No. | Application | Liquid Precursor | Material deposited | Thickness range of film (nm) | Gas Precursor* |
|---|---|---|---|---|---|
| 1 | Barrier layer deposition | Titanium tetrachloride ($TiCl_4$) | Titanium nitride | 0.01–100 | Ammonia ($NH_3$) |
| 2 | Barrier layer deposition | Titanium tetraiodide ($TiI_4$) | Titanium | 0.01–100 | N/A |
| 3 | Barrier layer deposition | Tetrakis-(diethylamino)titanium ($[Ti(NEt_2)_4]$ or TDEAT | Titanium nitride | 0.01–100 | Ammonia ($NH_3$) |
| 4 | Barrier layer deposition | Tetrakis-(dimethylamino)titanium ($[Ti(NMe_2)_4]$ or TDMAT | Titanium nitride | 0.01–100 | Ammonia ($NH_3$) |
| 5 | Interconnect metal line | Cuprase1ect ™ | Copper | 0.01–1000 | Hydrogen |
| 6 | Interconnect metal line | dimethyl-1,5-cyclooctadiene Cu | Copper | 0.01–1000 | Hydrogen |
| 7 | Interconnect metal line | trimethylvinylsilane Cu hexafluoroacetylacetonate | Copper | 0.01–1000 | Hydrogen |
| 8 | Interconnect metal line | Cyclopentadienylcopper alkylphosphine adducts $(n^5-C_5H_5)CuPr_3$ | Copper | 0.01–1000 | Hydrogen |
| 9 | Interconnect metal line | hexafluoroacetylacetonate Cu 1,5- | Copper | 0.01–1000 | Hydrogen |

TABLE 2-continued

| No. | Application | Liquid Precursor | Material deposited | Thickness range of film (nm) | Gas Precursor* |
|---|---|---|---|---|---|
| 10 | Interconnect metal line | cyclooctadiene Dimethyl aluminum hydride (DMAH) | Aluminum | 0.01–1000 | Hydrogen |
| 11 | Interconnect metal line | Dimethylaminalane (DMEA) | Aluminum | 0.01–1000 | Hydrogen |
| 12 | Interconnect metal line | Triisobutylaluminum (TIBA) | Aluminum | 0.01–1000 | Hydrogen |
| 13 | Interconnect metal line | Trimethylaminalane (TMAA) | Aluminum | 0.01–1000 | Hydrogen |
| 14 | Interconnect metal line | Triethylaminalane (TEAA) | Aluminum | 0.01–1000 | Hydrogen |
| 15 | Interlevel dielectric (first layer) | Tetraethoxysilane (TEOS) + trimethylborate (TMB) + trimethylphosphite (TMP) | Borophosphosilicate glass | 0.01–1000 | Oxygen |
| 16 | Interlevel dielectric (first layer) | Diacetoxyditertiarybutoxysilane (DABS) | Borophosphosilicate glass | 0.01–1000 | Oxygen |
| 17 | Interlevel dielectric (higher layers) | amorphous fluoropolymer dissolved in fluorocarbon solvent | fluoropolymer | 0.01–1000 | N/A |
| 18 | Interlevel dielectric (higher layers) | oxydianiline and m-phenylenediamine copolymer with benzophenone tetracarboxylic acid dianhydride in n-methyl pyrolidone (NMP) | Polyimides | 0.01–1000 | N/A |
| 19 | Interlevel dielectric (higher layers) | Tetraethoxysilane (TEOS) | silicon dioxide | 0.01–1000 | Ozone ($O_3$) or other oxidizing gas |
| 20 | Interlevel dielectric (higher layers) | Tetramethylcyclotetrasiloxane (TMCTS) | silicon dioxide | 0.01–1000 | Ozone ($O_3$) or other oxidizing gas |
| 21 | Interlevel dielectric (higher layers) | Diethylsilane (DES) | silicon dioxide | 0.01–1000 | Ozone ($O_3$) or other oxidizing gas |
| 22 | Interlevel dielectric (higher layers) | Ditertiarybutysilane (DTBS) | Silicon dioxide | 0.01–1000 | Ozone ($O_3$) or other oxidizing gas |
| 23 | Interlevel dielectric (higher layers) | Tetramethylorthosilicate (TMOS) | Silicon dioxide | 0.01–1000 | Ozone ($O_3$) or other oxidizing gas |
| 24 | III-V compound semiconductor | Trimethyl gallium + trimethylarsine | Gallium arsenide | 0.01–500 | N/A |
| 25 | III-V compound semiconductor | Gallium acetylacetonate + tributylphosphate | Gallium phosphate | 0.01–500 | N/A |
| 26 | II-VI compound semiconductor | Bis(diethyldithiocarbamato)zinc II | Zinc sulfide | 0.01–500 | N/A |
| 27 | High K dielectric for dynamic radom access memories | Tantalum pentaethoxide | Tantalum Oxide | 0.5–1000 | N/A |

*The gas listed is exemplary. The liquid precursor may or may not react with the gas depending on the application. Wherever "N/A" is mentioned, an inert gas (such as nitrogen and argon) could be used to fill up the reactor and thereby prevent any unwanted side reactions that would otherwise take place with atmospheric oxygen.

As shown in the above table, some of the liquid precursors react with a gas in forming the solid material. The gas can be added to the liquid precursor in the reactor vessel or can be used to atomize the liquid precursor.

It should be understood, that the above table is merely exemplary and does not represent an exhaustive list of all applications for the process of the present invention. Further applications not listed in the table include void filling in dielectric layers and molecular device fabrication.

The present invention may be better understood with reference to the following examples.

EXAMPLE NO. 1

Various fluoropolymer films were formed using the process of the present invention. The temperature and time at which the film was formed and cured was varied. Further, some of the samples were made using ultraviolet light and thermal light energy while other samples were made using only thermal light energy. The samples were evaluated for stress and surface roughness.

A liquid precursor was first formulated containing 0.4 percent by weight TEFLON AF 1600 fluorocarbon polymer obtained from DuPont in an organic fluorocarbon solvent. The fluorocarbon solvent was obtained from the 3M Corporation and is marketed under the tradename FC-77.

The liquid precursor was atomized using a stainless steel nozzle. The nozzle atomized the liquid using argon gas at a pressure of about 30 psi. The liquid precursor was atomized into liquid droplets having a diameter of from about 13 microns to about 17 microns.

The droplets emerging from the nozzle were directed towards a 1 inch diameter thin silicon substrate supported on a quartz holder within a quartz reactor. The liquid droplets and the substrate were heated using a plurality of lamps. During some of the tests, lamps emitting ultraviolet rays were also used. In particular, tungsten halogen lamps were used to provide thermal energy, while mercury vapor lamps were used to provide ultraviolet radiation.

As the liquid droplets traveled towards the substrate, the solvent contained within the droplets was vaporized. The light energy caused the fluorocarbon polymer to polymerize and form a solid coating on the substrate. After formation, the polymer coating was cured.

Figure 3:
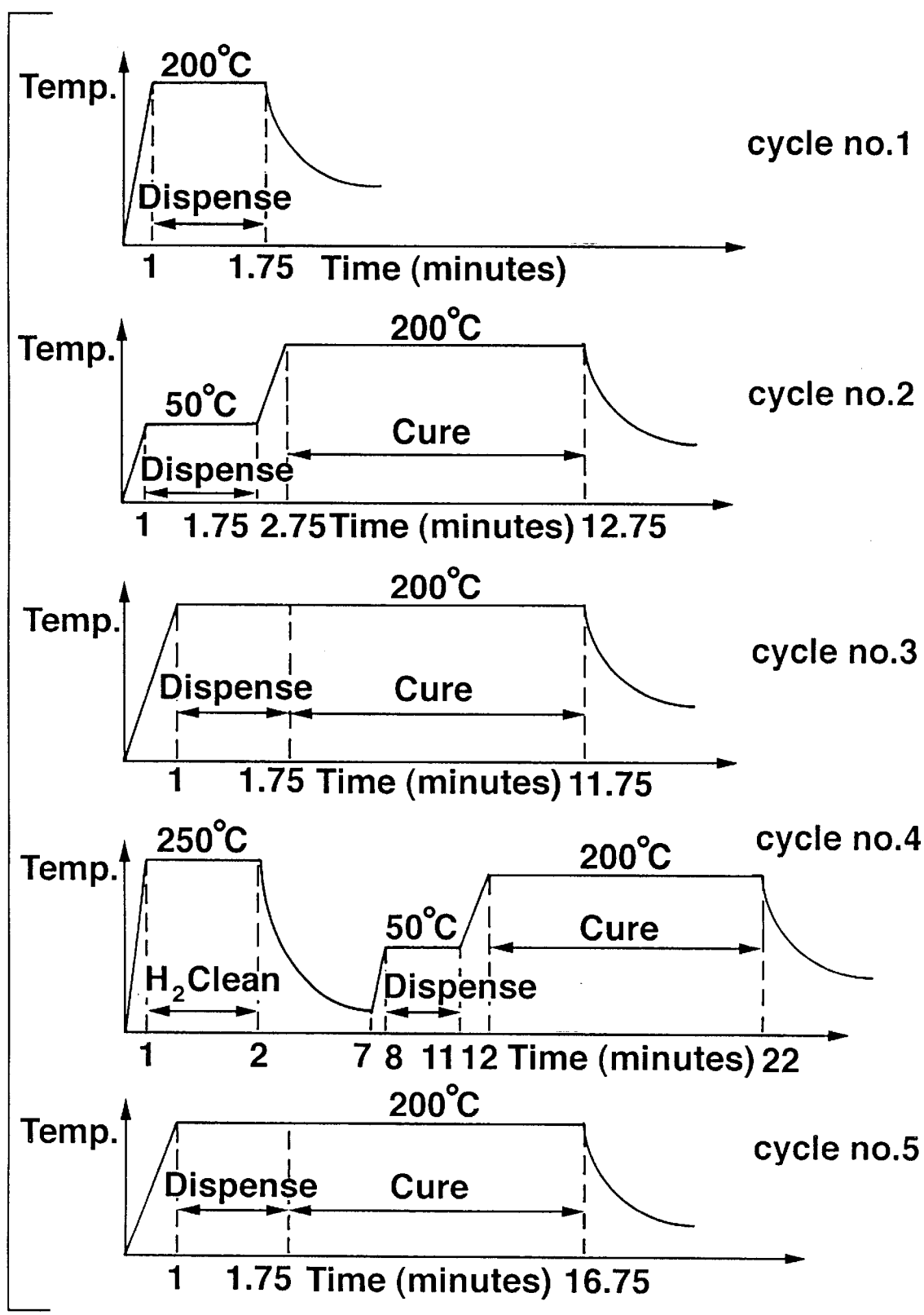
FIG. 3 illustrates the processing cycles used to fabricate the samples tested in Example 1.

As illustrated in FIG. 3, five different processing cycles were used to form ten different polymer film samples. For each processing cycle shown in FIG. 3 a polymer film sample was made using a combination of ultraviolet light and thermal light energy while another sample was made using only thermal light energy. In general, the liquid droplets were injected into the reactor at either 50° C. or 200° C.

In cycle number 4, the reactor was first evacuated and in situ predeposition cleaning was carried out using hydrogen gas and vacuum ultraviolet radiation at 250° C.

Figure 4:
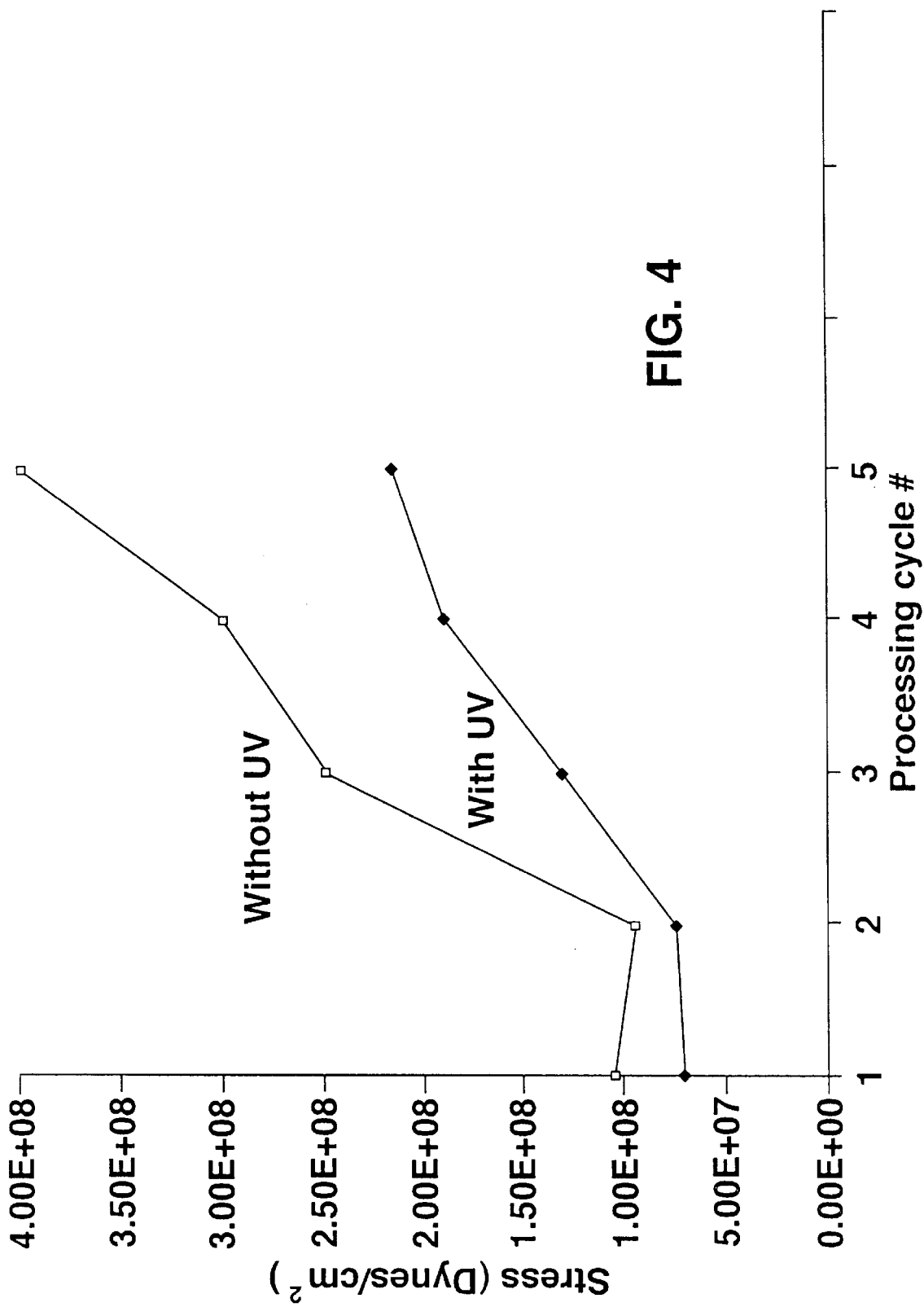
FIG. 4 is a graphical representation of the results obtained in Example 1.
Figure 5:
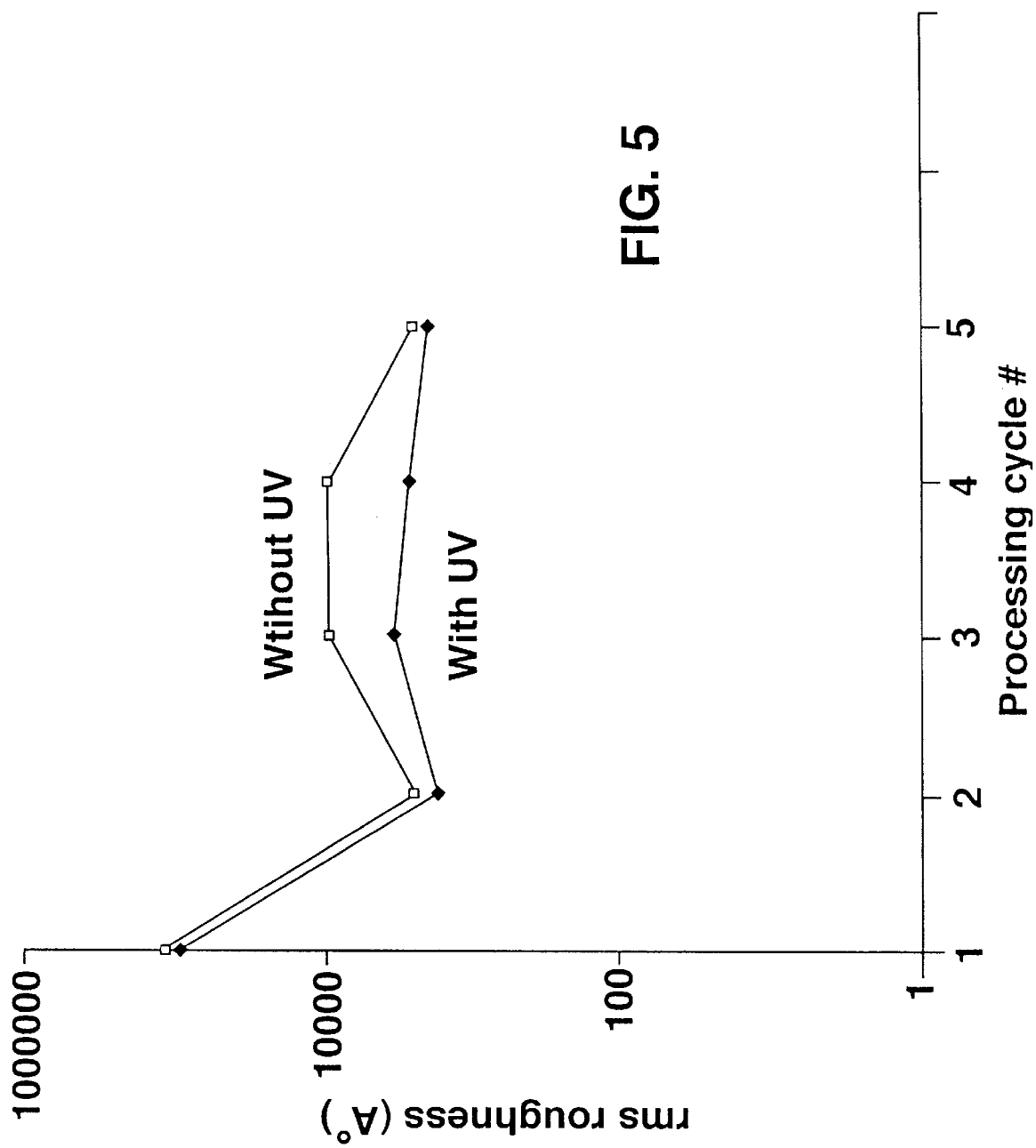
FIG. 5 is a graphical representation of the results obtained in Example 1.

The fluoropolymer film thickness for each sample was approximately 3 microns on the silicon substrate. The samples were evaluated for stress and roughness. These measurements were made using DEKTAK software package. The results of the tests are illustrated in FIGS. 4 and 5.

As shown in the figures, better results were consistently obtained when ultraviolet light was used to form the samples. Specifically, the use of ultraviolet light in forming the fluorocarbon polymer films created less stress and decreased roughness. From the graphs, it appears that the best results were obtained using processing cycle number 2 in which the film was formed at 50° C. and then cured for ten minutes at 200° C.

EXAMPLE NO. 2

The following tests were performed to demonstrate the differences between fluoropolymer films formed according to the process of the present invention and a similar fluoropolymer film formed according to a prior art spin coating technique.

Similar to Example No. 1 above, a 0.4 percent by weight solution of TEFLON AF 1600 in a fluorocarbon solvent was fed into a nozzle and was atomized using argon gas. The atomized droplets were injected into a reactor at 50° C. for three minutes. The droplets were directed towards a 1 inch diameter silicon wafer containing aluminum contacts that were formed on the wafer prior to deposition. As the droplets were directed towards the substrate, they were exposed to light energy causing a fluoropolymer film to form.

Two samples were produced according to the above process. One sample was made using only thermal light energy while a second sample was produced using a combination of thermal energy and optical energy in the form of ultraviolet light. The film thickness for each sample was approximately 3 microns. After the film was formed, it was annealed or cured at 200° C. for ten minutes.

For purposes of comparison, a 6 percent by weight solution containing TEFLON AF 1600 fluoropolymer was formulated and spin coated on three silicon substrates also containing aluminum contacts.

In forming each of the three samples, the substrate was placed on a vacuum chuck and rotated at 500 rpm. The 6 percent fluoropolymer solution was then applied to the rotating substrate for thirty seconds. A 6 percent fluoropolymer solution was used in order to create a 3 micron thick film on each substrate.

After the fluoropolymer film was formed, each of the three samples were annealed at 200° C. for 10 minutes. Specifically, one sample was hot plate annealed. A second sample was placed in the quartz reactor used to make the polymer films of the present invention and annealed using thermal light energy. The third sample was similarly placed in the quartz reactor and annealed using thermal light energy in combination with ultraviolet light.

The above described spin coated samples were made substantially in accordance with prior art constructions.

Figure 6:
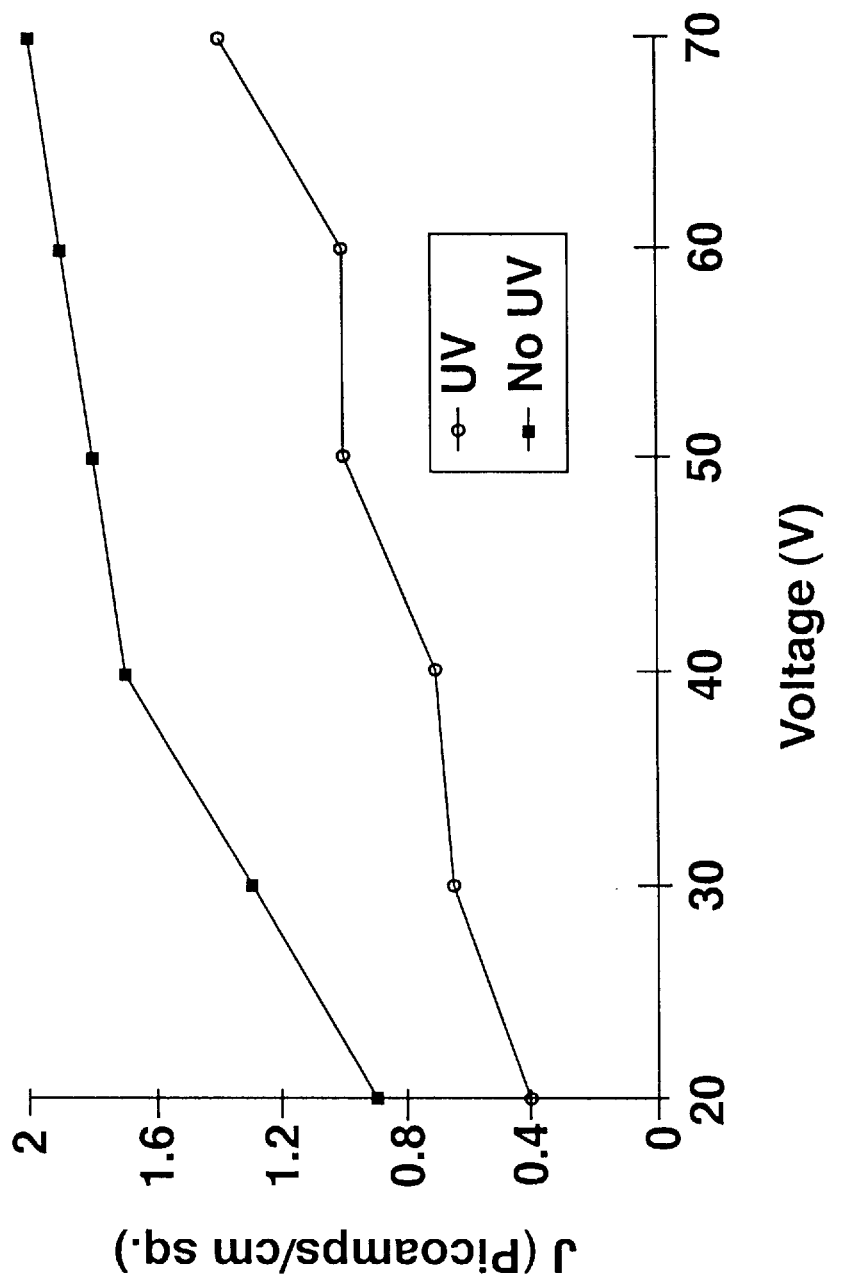
FIG. 6 is a graphical representation of the results obtained in Example 2.
Figure 7:
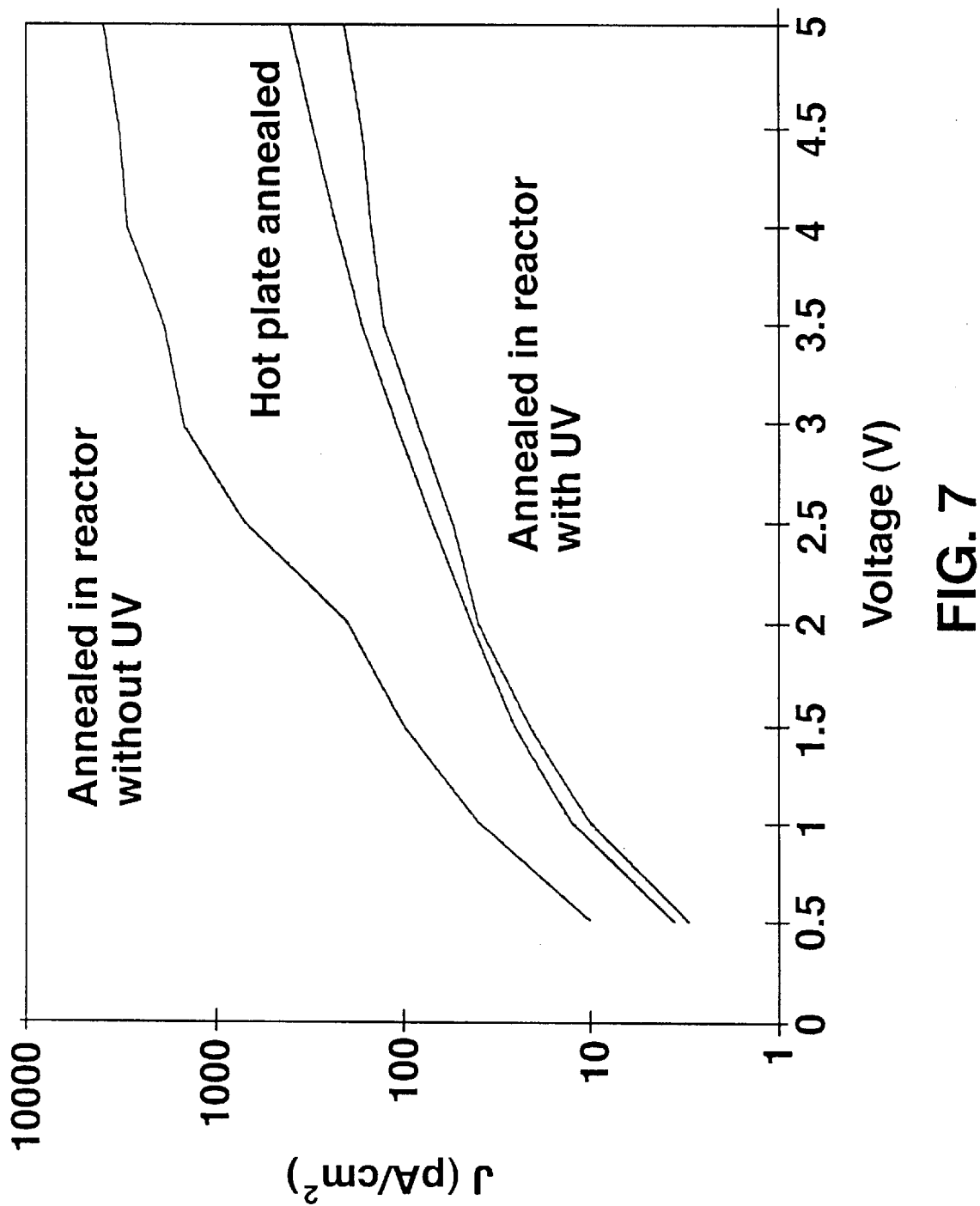
FIG. 7 is a graphical representation of the results obtained in Example 2.

Each of the two samples made according to the process of the present invention and the three spin coated samples were tested for leakage current, which indicates the effectiveness of the film as an insulator. Specifically, the aluminum contacts were connected to an HP 4140B picoammeter interfaced with an HP 9236 computer to obtain a plot of current density versus voltage (J-V). The results are illustrated in FIGS. 6 and 7. In particular, the results obtained from the two samples made according to the process of the present invention are illustrated in FIG. 6, while FIG. 7 illustrates the results obtained with the prior art products.

As shown, although the fluoropolymer films made according to the present invention have the same thickness and were made according to the same processing cycle as the spin-on films, the samples of the present invention were far superior to the prior art samples. As shown, the fluoropolymer films made according to the present invention did not conduct current below 20 volts. The spin-on films, on the other had, conducted appreciable current for even lower voltages. The films made according to the present invention had about 3 orders of magnitude improvement over the spin-on films.

Comparing the two samples made according to the process of the present invention, as shown in FIG. 6, the film made using ultraviolet light had better insulating properties in comparison to the film using only thermal energy.

EXAMPLE NO. 3

The following tests were performed in order to demonstrate that films made according to the present invention do not undergo a substantial amount of weight loss when exposed to higher temperatures.

Similar to Example No. 1 above, a 0.4 percent by weight solution of TEFLON AF 1600 in a fluorocarbon solvent was fed into a nozzle and atomized using argon gas. Fifteen (15) milliliters of the solution was injected into a reactor at 50° C. and directed towards a silicon wafer. As the droplets were directed towards a the substrate, they were exposed to light energy causing a fluoropolymer film to form.

Six (6) samples were produced according to the above process. Three (3) of the samples were made using only thermal light energy while another three (3) samples were produced using a combination of thermal energy and optical energy. The film thickness for each sample was approximately three (3) microns.

Each fluoropolymer sample was etched off the substrate and placed on a weight balance. Each sample was heated to either 350° C., 400° C. or 450° C. for two (2) hours and cured under a nitrogen blanket. During curing, the weight loss of each sample was monitored and recorded. For each of the above temperatures, a sample made using only thermal light energy and a sample made using a combination of thermal light energy and optical light energy were cured. The results are illustrated in FIGS. 8, 9 and 10.

Figure 8:
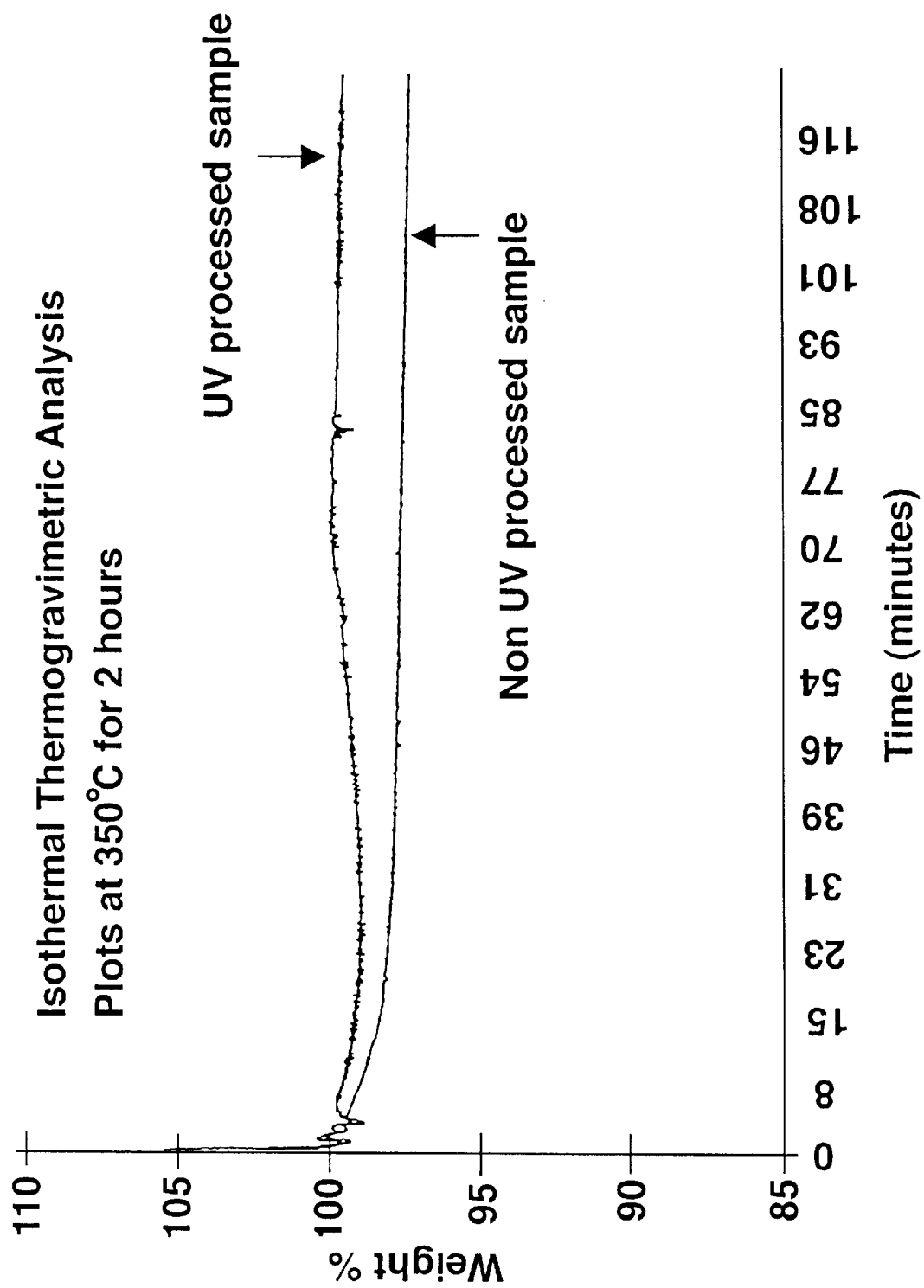
FIG. 8 is a graphical representation of the results obtained in Example 3.
Figure 9:
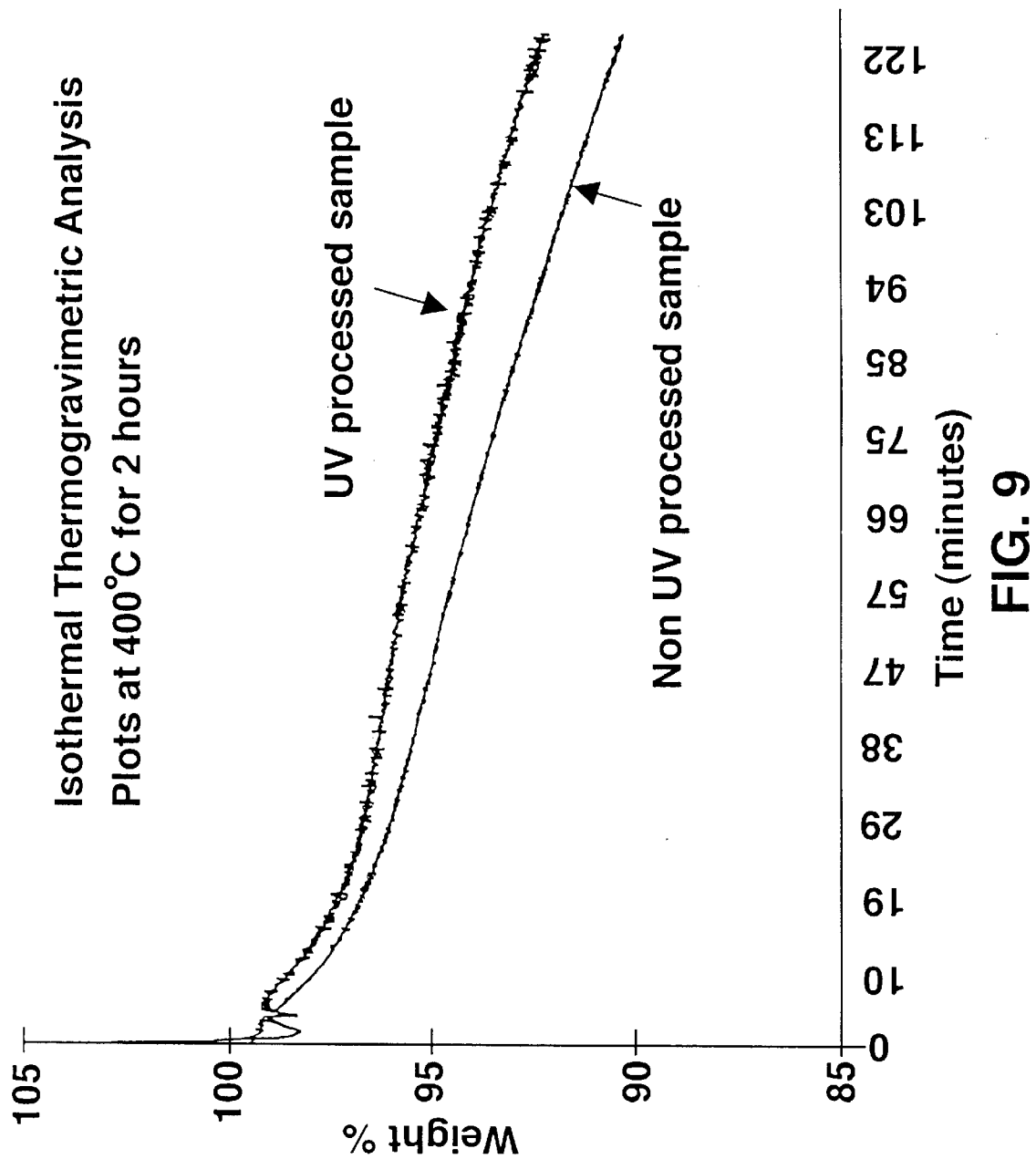
FIG. 9 is a graphical representation of the results obtained in Example 3.
Figure 10:
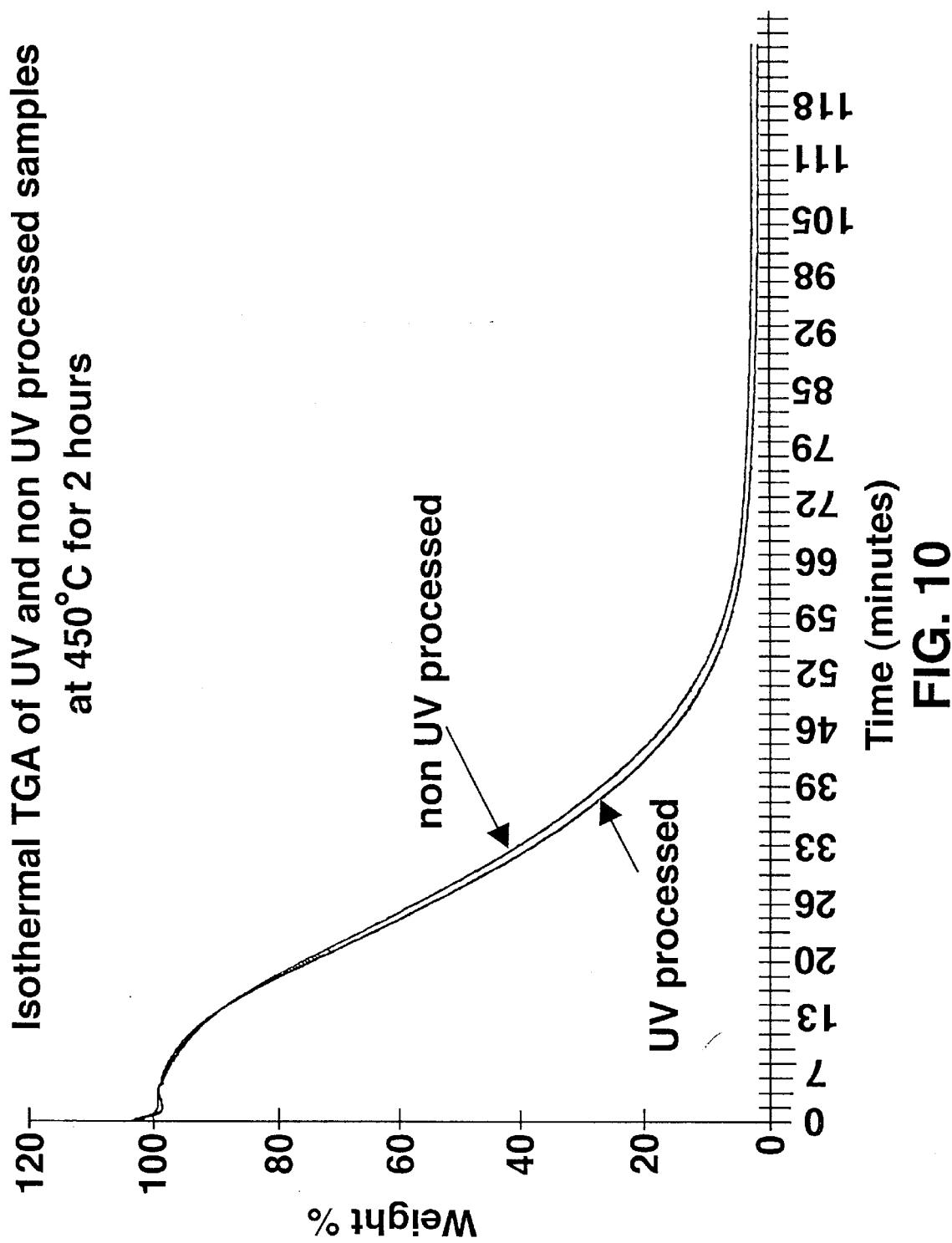
FIG. 10 is a graphical representation of the results obtained in Example 3.

As shown in FIGS. 8 and 9, at 350° C. and at 400° C., the fluoropolymer samples made according to the present invention did not loose more than 10 percent of their weight during curing. In fact, at 350° C., the weight loss was minimal. It is believed that at 450° C., the fluoropolymer material itself begins to break down. Overall, the weight loss experienced by the samples made according to the present invention compare favorably to films made according to prior art processes.

As also shown from FIGS. 8 and 9, the samples made using optical light energy lost less weight and were generally more stable in comparison to the samples made using only thermal light energy.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for forming an electrical insulating layer in an integrated circuit comprising the steps of:

providing a solution containing an electrical insulating material and a solvent, said electrical insulating material comprising an amorphous fluorocarbon polymer;

atomizing said solution into droplets, said droplets being released into a processing chamber, said processing chamber containing a substrate comprising a semiconductive material, said droplets being deposited onto said substrate;

exposing said processing chamber to a combination of a first light energy source and a second light energy source while said droplets are being deposited on said substrate, said first light energy source emitting ultraviolet light energy, said second light energy source emitting thermal light energy, said light energy causing said amorphous fluorocarbon polymer to polymerize and form a solid coating on said substrate, said solid coating having a dielectric constant of less than about three.

2. A process as defined in claim 1, wherein said substrate comprises a silicon wafer.

3. A process as defined in claim 1, wherein said amorphous fluorocarbon polymer comprises a copolymer of tetrafluoroethylene and 2,2-bis(trifluoromethyl)-4,5-difluoro-1,3-dioxole.

4. A process as defined in claim 1, wherein said thermal light energy emitted by said second light energy source is primarily directed onto said substrate, and wherein said ultraviolet light energy being emitted by said first light energy source is primarily directed towards said droplets as said droplets are being deposited onto said substrate.

5. A process as defined in claim 1, further comprising the step of preheating said processing chamber to a temperature of at least 50° C. prior to releasing said droplets into said chamber.

6. A process as defined in claim 5, wherein said processing chamber is preheated to a temperature of at least 100° C.

7. A process as defined in claim 1, wherein said solvent comprises a fluorocarbon.

8. A process as defined in claim 1, wherein said light energy causes substantially all of said solvent contained within said droplets to evaporate prior to said amorphous fluorocarbon polymer being deposited onto said substrate.

9. A process as defined in claim 1, further comprising the step of maintaining a vacuum in said processing chamber as said droplets are deposited onto said substrate.

10. A process as defined in claim 1, wherein said first light energy source emits vacuum ultraviolet light energy.

11. A process as defined in claim 1, wherein said solid coating of said amorphous fluorocarbon polymer that is deposited onto said substrate has a thickness of from about 1 monolayer to about 1 micron.

12. A process as defined in claim 1, wherein said thermal light energy being emitted by said second light energy source has a wavelength greater than about 0.8 microns.

13. A process as defined in claim 1, wherein said light energy causes an attraction to occur between said amorphous fluorocarbon polymer and said substrate.

14. A process as defined in claim 1, wherein said droplets enter said processing chamber above said substrate.

15. A process for forming an electrical insulating layer in an integrated circuit comprising the steps of:

providing a solution containing an electrical insulating material in a liquid form, said electrical insulating material comprising a material selected from the group consisting of a fluorocarbon polymer and a polyimide polymer;

atomizing said solution into liquid droplets;

directing said liquid droplets into a processing chamber towards a substrate;

exposing said processing chamber to a combination of optical light energy and thermal light energy prior to said liquid droplets contacting said substrate, said light energy causing atomic and molecular excitation and said thermal light energy causing vibrational motion of molecules, said light energy causing said electrical insulating material to polymerize and form a solid coating on said substrate, said solid coating having a dielectric constant of less than about three.

16. A process as defined in claim 15, wherein a first light energy source primarily emits said optical light energy, and a second light energy source primarily emits said thermal light energy.

17. A process as defined in claim 16, wherein said optical light energy comprises ultraviolet light.

18. A process as defined in claim 16, wherein said thermal light energy being emitted by said second light energy source is primarily directed towards said substrate, while said optical light energy being emitted by said first light energy source is primarily directed towards said liquid droplets as said droplets are deposited onto said substrate.

19. A process as defined in claim 15, wherein said optical light energy comprises vacuum ultraviolet light.

20. A process as defined in claim 15, wherein said light energy causes substantially all of said solvent contained within said liquid droplets to evaporate prior to said electrical insulating material contacting said substrate.

21. A process as defined in claim 15, wherein said electrical insulating material comprises an amorphous fluorocarbon copolymer.

22. A process as defined in claim 21, wherein said amorphous fluorocarbon copolymer comprises a copolymer of tetrafluoroethylene and 2,2-bis(trifluoromethyl)-4,5-difluoro-1,3-dioxole.

23. A process as defined in claim 15, wherein said substrate comprises a silicon wafer.

24. A process as defined in claim 15, further comprising the step of preheating said processing chamber to a temperature of at least 50° C. prior to atomizing said solution.

25. A process as defined in claim 15, further comprising the step of annealing said solid coating on said substrate at a temperature of at least 200° C. using light energy.

26. A process for forming an electrical insulating layer in an integrated circuit comprising the steps of:

providing a solution containing an electrical insulating material and a solvent;

atomizing said solution into droplets, said droplets being released into a processing chamber, said processing chamber containing a substrate comprising a semiconductive material, said droplets being deposited onto said substrate; and exposing said processing chamber to a combination of optical light energy and thermal light energy while said droplets are being deposited onto said substrate, said light energy causing substantially all of said solvent contained within said droplets to evaporate prior to said electrical insulating material contacting said substrate, said light energy also causing said electrical insulating material to polymerize and form a continuous solid coating on said substrate, said solid coating having a dielectric constant of less than about three.

27. A process as defined in claim 26, wherein a first light energy source primarily emits said optical light energy, while a second light energy source primarily emits said thermal light energy.

28. A process as defined in claim 27, wherein said optical light energy comprises ultraviolet light.

29. A process as defined in claim 27, wherein said thermal light energy being emitted by said second light energy source is primarily directed towards said substrate, while said optical light energy being emitted by said first light energy source is primarily directed towards said liquid droplets as said droplets are being deposited onto said substrate.

30. A process as defined in claim 26, wherein said optical light energy comprises vacuum ultraviolet light.

31. A process as defined in claim 26, further comprising the step of preheating said processing chamber to a temperature of at least 50° C. prior to atomizing said solution.

32. A process as defined in claim 26, wherein said electrical insulating material comprises a material selected from the group consisting of a fluorocarbon polymer and a polyimide polymer.

33. A process as defined in claim 26, wherein said electrical insulating material comprises an amorphous fluorocarbon copolymer.

34. A process as defined in claim 33, wherein said amorphous fluorocarbon copolymer comprises a copolymer of tetrafluoroethylene and 2,2-bis(trifluoromethyl)-4,5-difluoro-1,3-dioxole.

35. A process for forming an electrical insulating layer in an integrated circuit comprising the steps of:

providing a solution containing an electrical insulating material and a solvent;

atomizing said solution into droplets, said droplets being released into a processing chamber, said processing chamber containing a substrate comprising a semiconductive material, said droplets being deposited onto said substrate; and exposing said processing chamber to light energy as said droplets are deposited onto said substrate, said light energy comprising vacuum ultraviolet light, said vacuum ultraviolet light causing said electrical insulating material to polymerize and form a solid coating on said substrate.

36. A process as defined in claim 35, wherein said processing chamber is also exposed to thermal light energy while said droplets are being deposited onto said substrate.

37. A process as defined in claim 36, wherein a first light energy source emits said vacuum ultraviolet light and a second light energy source emits said thermal light energy, said thermal light energy being directed primarily at said substrate while said vacuum ultraviolet light being directed primarily at said droplets as said droplets are being deposited onto said substrate.

38. A process as defined in claim 35, wherein said electrical insulating material comprises a material selected from the group consisting of a fluorocarbon polymer and a polyimide polymer.

39. A process as defined in claim 35, wherein said electrical insulating material comprises an amorphous fluorocarbon copolymer.

40. A process as defined in claim 35, wherein substantially all of said solvent contained within said liquid droplets is evaporated prior to said electrical insulating material contacting said substrate.

* * * * *